United States Patent
Zhang et al.

(10) Patent No.: US 11,082,071 B2
(45) Date of Patent: Aug. 3, 2021

(54) QUALITY OF SERVICE (QOS) AWARE DATA STORAGE DECODER

(71) Applicant: SK hynix Inc., Gyeonggi-do (KR)

(72) Inventors: Fan Zhang, Fremont, CA (US);
Chenrong Xiong, San Jose, CA (US);
Xuanxuan Lu, San Jose, CA (US);
Meysam Asadi, San Jose, CA (US)

(73) Assignee: SK hynix Inc., Icheon-si (KR)

( * ) Notice: Subject to any disclaimer, the term of this patent is extended or adjusted under 35 U.S.C. 154(b) by 2 days.

(21) Appl. No.: 16/450,722

(22) Filed: Jun. 24, 2019

(65) Prior Publication Data

US 2020/0403642 A1  Dec. 24, 2020

(51) Int. Cl.
*H03M 13/00* (2006.01)
*H03M 13/29* (2006.01)
*H03M 13/01* (2006.01)
*H03M 13/37* (2006.01)

(52) U.S. Cl.
CPC ....... *H03M 13/2927* (2013.01); *H03M 13/01* (2013.01); *H03M 13/3723* (2013.01); *H03M 13/6502* (2013.01)

(58) Field of Classification Search
CPC ......... H03M 13/2927; H03M 13/3723; H03M 13/01; H03M 13/6502; H03M 13/1102; H03M 13/1148; H04L 12/2487; G06F 11/108; G06F 17/30218; G11B 2020/185
USPC ................. 714/746, 752, 773, 776
See application file for complete search history.

(56) References Cited

U.S. PATENT DOCUMENTS

| | | | |
|---|---|---|---|
| 7,701,884 B2 * | 4/2010 | Chapweske | H04L 1/0002 370/260 |
| 8,335,949 B2 | 12/2012 | Chugg et al. | |
| 8,996,957 B1 | 3/2015 | Northcott et al. | |
| 9,104,482 B2 * | 8/2015 | Merchant | G06F 11/008 |
| 9,176,814 B2 | 11/2015 | Cherubini et al. | |
| 9,729,171 B2 | 8/2017 | Motwani et al. | |
| 10,250,281 B2 | 4/2019 | Achtenberg et al. | |
| 2013/0179754 A1 * | 7/2013 | Cherubini | G06F 11/1068 714/773 |
| 2014/0063915 A1 * | 3/2014 | Cronie | G11C 11/565 365/149 |

(Continued)

OTHER PUBLICATIONS

Lorenzo Zuolo, "LDPC Soft Decoding with Improved Performance in 1X-2X MLC and TLC NAND Flash-Based Solid State Drives," "IEEE Transactions on Emerging Topics in Computing ( Early Access ) Date of Publication: Mar. 2017".

*Primary Examiner* — Albert Decady
*Assistant Examiner* — Osman M Alshack
(74) *Attorney, Agent, or Firm* — Weaver Austin Villeneuve & Sampson LLP

(57) ABSTRACT

Techniques related to a QoS-aware decoder architecture for data storage are described. In an example, QoS specifications include a QOS latency specification indicative of an acceptable latency for completing the processing of a data read command. The decoder may store this QOS latency specification. In operation, the decoder generates a latency measurement indicative of the actual latency for the processing. If a comparison of the latency measurement and QOS latency specification indicates a violation of the QOS latency specification, the decoder can terminate the decoding and generate a decoding failure.

20 Claims, 9 Drawing Sheets

(56) References Cited

U.S. PATENT DOCUMENTS

| | | | |
|---|---|---|---|
| 2015/0268711 A1* | 9/2015 | Ramani | G06F 1/3203 |
| | | | 713/320 |
| 2017/0093439 A1* | 3/2017 | Motwani | H03M 13/1108 |
| 2017/0269991 A1* | 9/2017 | Bazarsky | G06F 11/1012 |
| 2017/0310342 A1* | 10/2017 | Yen | H03M 13/3715 |
| 2017/0331500 A1* | 11/2017 | Bhatia | H03M 13/3977 |
| 2018/0157551 A1* | 6/2018 | Ryabinin | G06F 1/04 |
| 2019/0034269 A1 | 1/2019 | Kalavadk et al. | |
| 2019/0114276 A1* | 4/2019 | Hodes | G06F 3/0679 |
| 2019/0140784 A1* | 5/2019 | Xi | H03M 13/373 |
| 2019/0310912 A1* | 10/2019 | Parthasarathy | H03M 13/2948 |

* cited by examiner

QUALITY OF SERVICE (QOS) AWARE DATA STORAGE DECODER

CROSS-REFERENCES TO RELATED APPLICATIONS

NOT APPLICABLE

STATEMENT AS TO RIGHTS TO INVENTIONS MADE UNDER FEDERALLY SPONSORED RESEARCH AND DEVELOPMENT

NOT APPLICABLE

REFERENCE TO A "SEQUENCE LISTING," A TABLE, OR A COMPUTER PROGRAM LISTING APPENDIX SUBMITTED ON A COMPACT DISK

NOT APPLICABLE

BACKGROUND

Solid-state drive (SSD) are manufactured according to a set of specifications. If there is any violation to the set, the SSD may be considered to have reached its end of life (EOL) and should be replaced. In enterprise SSD's, quality of service (QoS) is considered as the EOL limiting factor. When an enterprise SSD is approaching its EOL, the first violation is likely observed as QoS violation. A QoS specification can be defined by the maximum latency for different percentage of read/write commands to be finished and returned to a host. The specification on low 9's such as 90%, 99%, 99.9% etc. are often referred to as low-9 QoS specification. The low 9 latency is often dominated by a decoder latency. Mactors in an SSD can cause the overall latency, such as NAND read time, command collision, error correction code (ECC) decoding latency variation, etc.

BRIEF SUMMARY

Techniques related to a QoS-aware decoder architecture for data storage are described. In an example, an ECC decoder receives a data read command during a time window. The data read command is associated with a codeword stored in a memory. The ECC decoder starts a decoding of the codeword based on an ECC procedure. The ECC decoder measures a latency associated with the decoding and maintains a latency measurement for the time window based on the latency. The ECC decoder compares the latency measurement and a quality of service (QoS) latency and terminates the decoding based on the comparing.

In an example, the latency measurement includes a latency distribution over the time window. The latency distribution includes a first normalized counter associated with first data read commands processed by the ECC decoder within a first latency interval. The latency distribution further includes a second normalized counter associated with second data read commands processed by the ECC decoder within a second latency interval. the latency distribution is generated by the ECC decoder by at least: determining that the latency associated with the decoding in response to the data read command falls within the first latency interval, incrementing a first counter associated with the first latency interval based on the determining that the latency falls with the first latency interval, generating a sum of the first counter and at least a second counter associated with the second latency interval, and generating the first normalized counter based on first count and the sum. In a further example, a portion of the first data read commands is received in the time window, and wherein a remaining portion of the first data read commands is received in a previous time window.

In an example, comparing of the latency measurement and the QOS latency specification indicates a violation of the QOS latency specification. The decoding is terminated based on the violation. The latency measurement includes a normalized counter associated with data read commands processed by the ECC decoder within a latency interval. The QOS latency specification includes a probability associated with completing a processing of the data read command within the latency interval. The violation is determined by the ECC decoder by at least determining that the normalized counter exceeds the probability.

In an example, the ECC decoder further detects a trigger event to shift from the time window to a second time window. The ECC decoder accesses a second latency measurement for the second time window based on the trigger event. The ECC decoder updates the latency measurement based on the second latency measurement. the second latency measurement includes a second latency distribution. The ECC decoder also initializes the second latency measurement for the second time after the updating of the latency measurement. In a further example, detecting the trigger event includes determining that a number of decoded codewords has reached a threshold, and shifting the time window to the second time window based on determining that the number of decoded codewords has reached a threshold.

In an example, the ECC decoder is a computing component of a computer system that also includes a memory. The ECC decoder is configured to perform the operations described herein above. The data read command is received from a host. The ECC decoder is further configured to send an indication of a decoding failure to the host based on the terminating of the decoding. the QOS latency specification comprises a probability of completing a processing of the data read command within a latency interval. The ECC decoder is also further configured to store the probability in a first vector and the latency interval in a second vector. The first vector is stored in a register that is configurable by a firmware of the ECC decoder. The latency measurement includes a normalized counter associated with data read commands processed by the ECC decoder within a latency interval. The ECC decoder is further configured to store the normalized counter in a third vector. Comparing the latency measurement and the QOS latency specification includes comparing the first vector and the third vector. The decoding is terminated based on the comparing of the first vector and the third vector indicating a violation of the QOS latency specification.

These illustrative examples are mentioned not to limit or define the disclosure, but to provide examples to aid understanding thereof. Additional embodiments and examples are discussed in the Detailed Description, and further description is provided there.

BRIEF DESCRIPTION OF THE DRAWINGS

An understanding of the nature and advantages of various embodiments may be realized by reference to the following figures.

DETAILED DESCRIPTION

Figure 1:
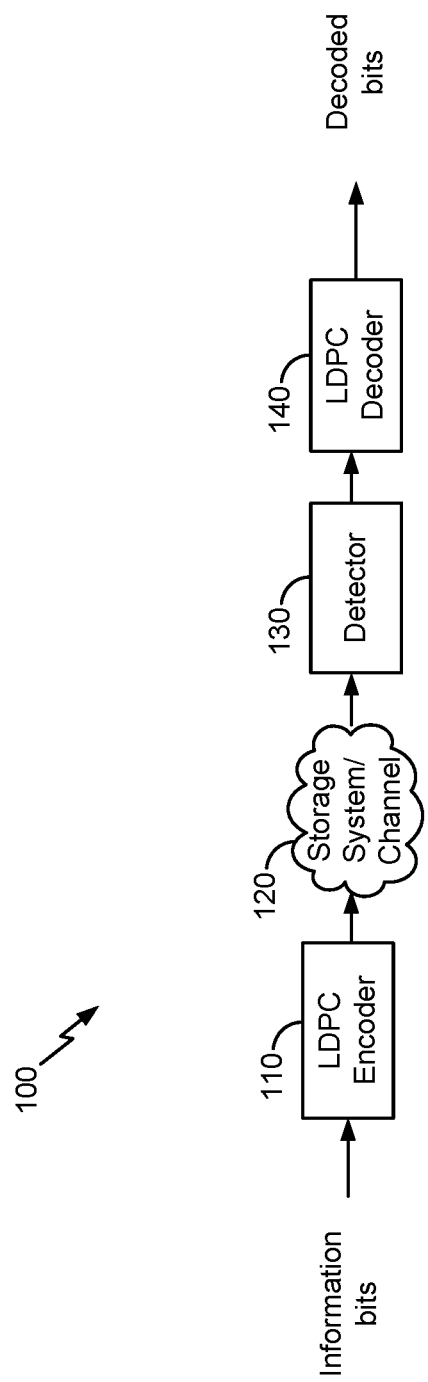
FIG. 1 illustrates an example of a high level block diagram of an error correcting system, in accordance with certain embodiments of the present disclosure.

Techniques related to a QoS-aware decoder architecture for data storage are described. In an example, storage of data, such as SSD, includes a certain type of memory (e.g., one using NAND) storing the data and a decoder for reading the data from the memory. The data is protected with an error correction code (ECC) and is stored in the memory as codewords. The decoder can include an ECC decoder that decodes the codewords to output read data. The ECC decoder can integrate a set of specifications related to QoS (referred to herein as QoS specifications) such that the decoding is performed according to this set.

In particular, the QoS specifications include a QOS latency specification indicative of an acceptable amount of processing completion of a data read command (e.g., percentage of the data read command to be finished and returned to a host) within a certain time latency. The ECC decoder may store such a QOS latency specification. In operation, the ECC decoder generates a latency measurement indicative of the actual latency for the processing completion. If a comparison of the latency measurement and QOS latency specification indicates a violation of the QOS latency specification, the ECC decoder can terminate the decoding and generate a decoding failure.

In an illustration, enterprise storage uses multiple SSDs. A host stores data in the SSDs for a client. Upon receiving a request of the client for the data, the host sends a data read command to the SSDs. Each of such SSDs include a QoS-aware ECC decoder. In turn, each QoS decoder stores the QOS latency specification as a set of probabilities "P" for completing the processing within a set of time latencies "T." For instance, these two sets can be stored as two vectors configurable by firmware of each QoS-aware ECC decoder. In turn, upon receiving a data read command, a QoS-aware ECC decoder of an SSD starts an ECC decoding procedure, such as one using low density parity check (LDPC) decoding procedure or any other type of ECC decoding procedure depending on the ECC used for protecting the data in the first place. The QoS-aware ECC decoder ensures that the QOS latency specification is met. More specifically, the QoS-aware ECC decoder maintains a set of counters "C" to recode the number of codewords that are decoded within a certain time window (e.g., a five second window). The QoS-aware ECC decoder also generates a set of normalized counters "Q" depending on the sum of the counters. By comparing the set of normalized counters "Q" to the set of probabilities "P," the QoS-aware ECC decoder can determine whether the QOS latency specification is likely to be violated. For instance, a potential violation is determined when any of the normalized counters exceeds a corresponding probability by a certain margin. In this case, the QoS-aware ECC decoder terminates the ECC decoding procedure and sends a notification to the host about a decoding failure.

The embodiments of the present disclosure provide several advantages related to computer storage. For example, the QOS latency specification can be satisfied, thereby extending the EOL of an SSD or ensuring that the lifetime specification is met. In another example, a decoding failure can be immediately sent to a host, thereby avoiding unnecessary additional decoding iterations which in turn reduces the processing latency (e.g., given the early termination, no additional processing time is used before declaring the decoding failure) and improves the overall use of processing resources (e.g., by avoiding unnecessary additional decoding iterations, the QoS-aware ECC decoder can be freed up to respond to other data read commands and the overall consumption of electrical power by the QoS-aware ECC decoder is improved).

In the interest of clarity of explanation, the embodiments of the present disclosure are described in connection with LDPC decoding and enterprise SSD. However, the embodiments are not limited as such and apply to any other decoding procedures and any other type of storage. For brevity, a QoS-aware ECC decoder is referred to herein as a decoder, unless context indicates otherwise.

FIG. 1 illustrates an example of a high level block diagram of an error correcting system, in accordance with certain embodiments of the present disclosure. In the example, LDPC codes are described in connection with data storage. However, the embodiments of the present disclosure are not limited as such. Instead, the embodiments similarly apply to other usage of LDPC codes including, for example, data transmission.

LDPC codes are linear block codes defined by a sparse parity-check matrix H, which consists of zeros and ones. The term "sparse matrix" is used herein to refer to a matrix in which a number of non-zero values in each column and each row is much less than its dimension. The term "column weight" is used herein to refer to the number of non-zero values in a specific column of the parity-check matrix H. The term "row weight" is used herein to refer to number of non-zero values in a specific row of the parity-check matrix H. In general, if column weights of all of the columns in a parity-check matrix corresponding to an LDPC code are similar, the code is referred to as a "regular" LDPC code. On the other hand, an LDPC code is called "irregular" if at least one of the column weights is different from other column weights. Usually, irregular LDPC codes provide better error correction capability than regular LDPC codes.

The LDPC codes are also described according to the way they are constructed. Random computer searches or algebraic constructions are possible. The random computer search construction describes an LDPC code having a parity-check matrix designed by a random computer-based procedure. Algebraic construction implies that the parity-check matrix has been constructed based on combinatorial methods. Quasi-cyclic LDPC (QC-LDPC) codes fall under the latter construction method. One advantage of QC-LDPC codes is that they have a relatively easier implementation in terms of the encoding procedure. The main feature of QC-LDPC codes is that the parity-check matrix consists of circulant submatrices, which could be either based on an identity matrix or a smaller random matrix. Permutation vectors could also be used in order to create the circulant submatrices.

As illustrated, an LDPC encoder 110 receives information bits that include data which is desired to be stored in a storage system 120. LDPC encoded data is output by the LDPC encoder 110 and is written to the storage 120.

In various embodiments, the storage 120 may include a variety of storage types or media such as (e.g., solid state, magnetic) disk drive storage, flash storage, etc. In some embodiments, the techniques are employed in a transceiver and instead of being written to or read from storage, the data is transmitted and received over a wired and/or wireless channel. In this case, the errors in the received codeword may be introduced during transmission of the codeword.

When the stored data is requested or otherwise desired (e.g., by an application or client that stored the data), a detector 130 receives data from the storage system 120. The received data may include some noise or errors. The detector 130 performs detection on the received data and outputs decision and/or reliability information. For example, a soft output detector outputs reliability information and a decision for each detected bit. On the other hand, a hard output detector outputs a decision on each bit without providing corresponding reliability information. As an example, a hard output detector may output a decision that a particular bit is a "1" or a "0" without indicating how certain or sure the detector is in that decision. In contrast, a soft output detector outputs a decision and reliability information associated with the decision. In general, a reliability value indicates how certain the detector is in a given decision. In one example, a soft output detector outputs a log-likelihood ratio (LLR) where the sign indicates the decision (e.g., a positive value corresponds to a "1" decision and a negative value corresponds to a "0" decision) and the magnitude indicates how sure or certain the detector is in that decision (e.g., a large magnitude indicates a high reliability or certainty).

The decision and/or reliability information is passed to a LDPC decoder 140 (e.g., one that is a QoS-aware ECC decoder, as described in the present disclosure) which performs LDPC decoding using the decision and reliability information. A soft input decoder utilizes both the decision and the reliability information to decode the codeword. A hard decoder utilizes only the decision values in the decoder to decode the codeword. The decoded bits generated by the LDPC decoder 140 are passed to the appropriate entity (e.g., the application or client that requested it). With proper encoding and decoding, the information bits match the decoded bits.

In various embodiments, the system shown may be implemented using a variety of techniques including an application-specific integrated circuit (ASIC), a field-programmable gate array (FPGA), and/or a general purpose processor (e.g., an Advanced RISC Machine (ARM) core).

LDPC codes are usually represented by bipartite graphs. One set of nodes, the variable or bit nodes correspond to elements of the code word and the other set of nodes, e.g., check nodes, correspond to the set of parity-check constraints satisfied by the code words. Typically the edge connections are chosen at random. The error correction capability of an LDPC code is improved if cycles of short length are avoided in the graph. In a (r,c) regular code, each of the n variable nodes (V1, V2, . . . , Vn) has connections to r check nodes and each of the m check nodes (C1, C2, . . . , Cm) has connections to c bit nodes. In an irregular LDPC code, the check node degree is not uniform. Similarly the variable node degree is not uniform. In QC-LDPC codes, the parity-check matrix H is structured into blocks of p×p matrices such that a bit in a block participates in only one check equation in the block, and each check equation in the block involves only one bit from the block. In QC-LDPC codes, a cyclic shift of a code word by p results in another code word. Here p is the size of square matrix which is either a zero matrix or a circulant matrix. This is a generalization of a cyclic code in which a cyclic shift of a code word by 1 results in another code word. The block of p×p matrix can be a zero matrix or cyclically shifted identity matrix of size p×p.

Figure 2:
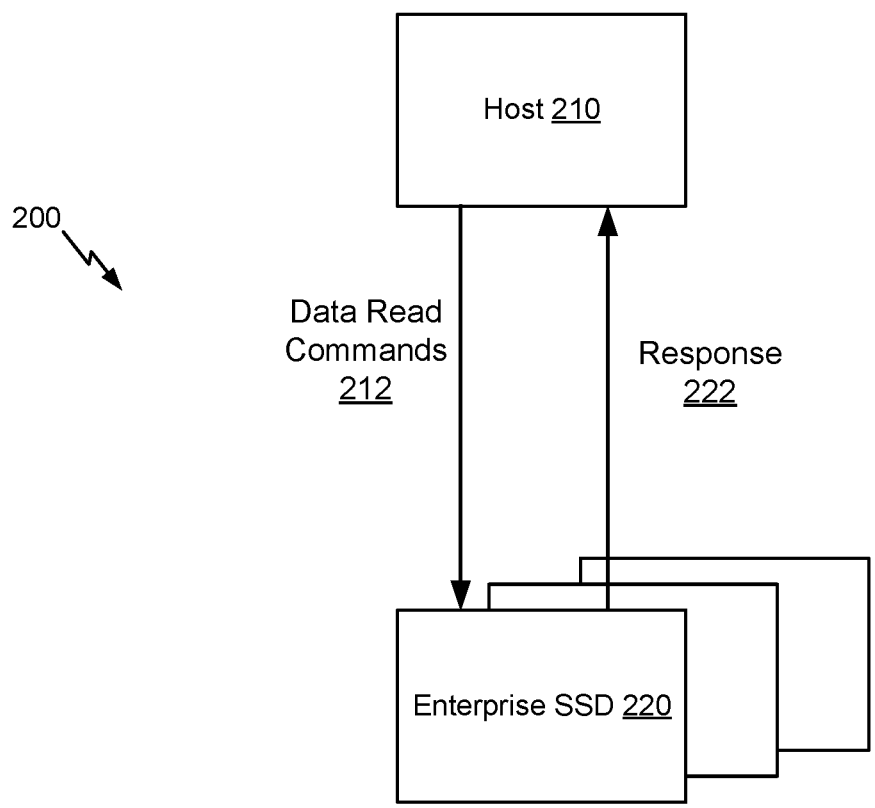
FIG. 2 illustrates an example architecture of an enterprise computer system, in accordance with certain embodiments of the present disclosure.

FIG. 2 illustrates an example architecture of an enterprise computer system 200, in accordance with certain embodiments of the present disclosure. In an example, the enterprise computer system 200 includes a host 210 and multiple enterprise SSDs 220. The host 210 stores data on behalf of clients in the SSDs 220. The data is stored in an enterprise SSD as codewords for ECC protection. For instance, the enterprise SSD can include an ECC encoder (e.g., the LDPC encoder 110 of FIG. 1). For a same client, portions of the data can be distributed across the enterprise SSDs 220 for security or can be redundantly stored in multiple enterprise SSDs 220.

The host 210 can receive a request of client for the client's data stored in the SSDs 220. In response, the host sends data read commands 212 to the enterprise SSDs 220 as applicable. Each of such enterprise SSDs 220 processes the received data read command and sends a response 222 to the host 210 upon completion of the processing. The response 222 can include the read data and/or a decoding failure. In an example, each of the enterprise SSDs includes an ECC decoder (e.g., the LDPC decoder 140 of FIG. 1) that is QoS aware. Processing the data read command and sending the response 222 includes decoding, by the QoS-aware ECC decoder, the codewords stored in the enterprise SSD to output the read data and/or the decoding failure.

Generally, an enterprise SSD can be a storage device that stores data persistently or caches data temporarily in non-volatile semiconductor memory and is intended for use in storage systems, servers (e.g., within datacenters), and direct-attached storage (DAS) devices. A growing number of enterprise applications need high data throughput and low transaction latency and SSDs are used as a viable storage solution to increase the performance, efficiency, reliability and lowering overall operating expenses. Enterprise SSDs generally use NAND flash memory and deliver higher performance and consume less power than spinning hard-disk drives (HDDs). NAND Flash memory has a number of inherent issues associated with it, the two most important include a finite life expectancy as NAND Flash cells wear out during repeated writes, and a naturally occurring error rate. Enterprise SSDs can be designed and manufactured according to a set of industry standards that define particular performance specifications, including latency specifications, to support heavier write workloads, more extreme environmental conditions and recovery from a higher bit error rate (BER) than a client SSD (e.g., personal computers, laptops, and tablet computers). Examples of advantages that an enterprise SSD may offer over a client SSD include higher performance, protection of DRAM-stored data in the event of a power loss, stronger error correction code (ECC), consistent and persistent quality of service, and a greater level of endurance.

Figure 3:
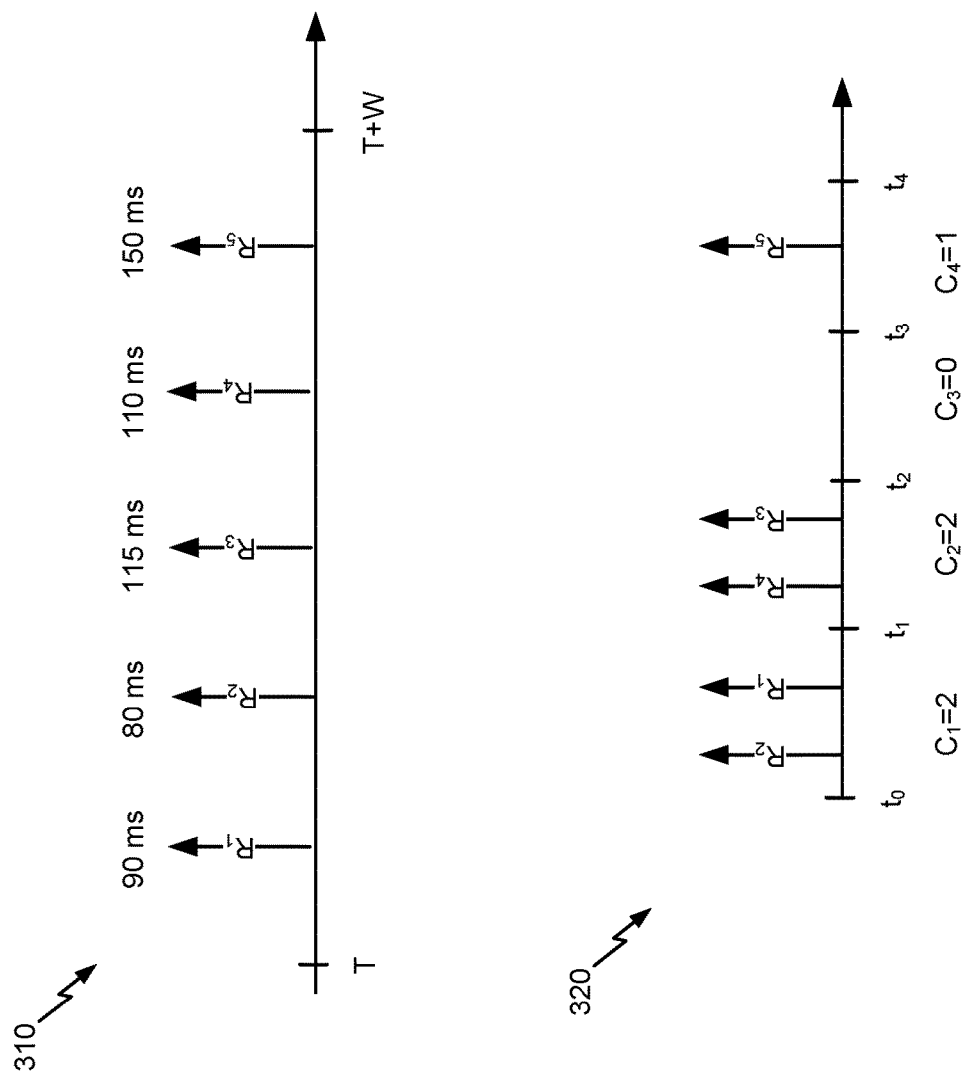
FIG. 3 illustrates an example of a latency measurement, in accordance with certain embodiments of the present disclosure.

FIG. 3 illustrates an example of a latency measurement, in accordance with certain embodiments of the present disclosure. As further described herein next, a decoder of an enterprise SSD has access to a QOS latency specification. By measuring the actual latency, the decoder can compare the resulting latency measurement to the QOS latency specification to then determine whether a violation of the QOS latency specification is likely. If the violation is likely, the decoder terminates the decoding and notifies the enterprise host (e.g., such as the host 210 of FIG. 2). Otherwise, the decoder continues the decoding and outputs the decoded data as applicable (e.g., no likely violation is detected in a next decoding iteration and no decoding termination is performed).

In an example, the QOS latency specification can be defined as two vectors: a probability vector "P" and a latency vector "T." $P=[p_1, p_2, p_3, \ldots, p_n]$ represents the probability of a codeword to be decoded within latency $T=[t_0, t_1, t_2, \ldots, t_n]$. the latency T represents the latency allocated to the decoding, from an overall latency that includes an overhead latency. For example $p_1$ can be 90%, $p_2$ can be 99%, $p_3$ can be 99.9%, and so and so forth corresponding to the low-9 QoS specification. $t_1$ can be 70 ms, $t_2$ can be 100 ms, $t_3$ can be 120 ms, and so on and so forth depending on the specified time latencies. The decoder ensures that its QoS can meet the QOS latency specification.

To do so, the decoder maintains a set of counters "C" to record the numbers $C=[c_1, c_2, \ldots, c_n]$, of codewords which are decoded within a certain time window "W." These counters can be referred as latency counters as they indicate the count of codewords that were decoded within particular latency intervals. For example "$c_i$" records the number of codewords that are decoded with latency between $t_{i-1}$ and $t_i$, assuming $t_{0-1}=0$. The time window "W" can be predefined to have a certain time duration, such as five seconds.

In this example, "S" denotes the sum of the counters (e.g., sum($c_i$)=S), and "$q_i$" denotes a normalized counter (e.g., $q_i=c_i/S$ for i=1, 2, ..., n). The decoder is configured to terminate a codeword if the QOS latency specification is likely to be violated when the decoder continues the decoding for more iterations. The way for the decoder to determine an expected QoS violation is to compare $q_i$ with $p_i$. For instance, assuming that the current decoding latency is falling between $t_{j-1}$ and $t_j$, if $q_i >= p_i - d$ for all $i >= j$, then there is a likely QoS violation and the decoder terminates the decoding immediately and sends a decoding failure. "d" is a predefined safety margin for the decoder to terminate decoding and sending the decoding failure. If there is no likely QoS violation, the decoder continues performing the decoding until a maximum number of iterations is reached, decoding is successful, or some other decoding termination criterion is met.

Turning to the specific illustration of FIG. 3, the figure shows an example of tracking 310 the processing of read commands within the time window "W" and example of tracking 320 the counters. As illustrated, five read commands (e.g., "$R_1$" to "$R_5$") are received within the time window "W" (e.g., between time "T" and time "T+W"). In this example illustration, a data read command is associated with a codeword and processing the data read command includes decoding this codeword (although the example techniques similarly apply to decoding multiple codewords that are associated with a same data read command). For each data read command, the decoder measures the latency of decoding the codeword corresponding to the data read commands. For example, the decoding of the first codeword corresponding to "$R_1$" is completed within 90 ms. The decoding of the second codeword corresponding to "$R_2$" is completed within 80 ms. The decoding of the third codeword corresponding to "$R_3$" is completed within 115 ms. The decoding of the fourth codeword corresponding to "$R_4$" is completed within 110 ms. And the decoding of the fifth codeword corresponding to "$R_5$" is completed within 150 ms.

In also this illustrative example, the QOS latency specification specifies four probabilities and five latencies: $p_1=90\%$, $p_2=99\%$, $p_3=99.9\%$, and $p_4=99.99\%$; and $t_0=70$ ms, $t_1=100$ ms, $t_2=120$ ms, $t_3=140$ ms, and $t_4=160$ ms. In the tracking 320 of the counters, the decoder defines four latency intervals corresponding to these specified latencies: a first latency interval between the specified latencies $t_0$ and $t_1$, a second latency interval between the specified latencies $t_1$ and $t_2$, a third latency interval between the specified latencies $t_2$ and $t_3$, and a fourth latency interval between the specified latencies $t_3$ and $t_4$. Accordingly, the decoder determines that the decoding of each of the first and second codewords falls in the first latency interval, the decoding of each of the third and fourth codewords falls in the second latency interval, and the decoding of the fifth codeword falls in the fourth latency interval. In other words, a determination is made that the processing of each of "$R_1$" and "$R_2$" is associated with the first latency interval, the processing of each of "$R_3$" and "$R_4$" is associated with the second latency interval, and the processing of "$R_5$" is associated with the fourth latency interval.

Given the tracking 320, the decoder determines that the total count of codewords for data reads received during the time window "W" and decoded within the first latency interval is two, the total count of codewords for data reads received during the time window "W" and decoded within the second latency interval is two, the total count of codewords for data reads received during the time window "W" and decoded within the third latency interval is zero, and the total count of codewords for data reads received during the time window "W" and decoded within the fourth latency interval is one. Accordingly, the decoder sets the first counter $c_1$ for the first latency interval to two, the second counter $c_2$ for the second latency interval to two, the third counter $c_3$ for the third latency interval to zero, and the fourth counter $c_4$ for the fourth latency interval to one.

Next, the decoder generates a sum S of $c_1+c_2+c_3+c_4$. In the above illustrative example, this sum is equal to five. Each of the counters is then normalized to generate normalized counters. Accordingly, the decoder generates a first normalized counter $q_1$ for the first latency interval to 40%, a second normalized counter $q_2$ for the second latency interval to 40%, a third normalized counter $q_3$ for the third latency interval to zero, and a fourth normalized counter $q_4$ for the fourth latency interval to 20%.

To determine whether a violation exists in a current decoding iteration, the decoder measures the current latency and determines that this latency falls, for instance, in the second latency interval (e.g., $t_{j-1}$ and $t_j$, where j=2; in other words, between $t_1$ and $t_2$). The decoder compares each of normalized counters $q_i$ to a corresponding probability $p_i$ specified by the QOS latency specification, for all "i" greater or equal to "j" (e.g., for i=2, 3, and 4). In other words, the decoder compares $q_2$ to $p_2$, $q_3$ to $p_3$, and $q_4$ to $p_4$. The comparison can use a predefined margin (e.g., a predefined percentage). In the illustrative example $q_2$ (40%) is smaller than $p_2$ (99%) plus the margin, $q_3$ (0%) is smaller than $p_3$ (99.9%) plus the margin, and $q_4$ (20%) is smaller than $p_4$ (99.99%) plus the margin. Hence, no likely QOS latency specification violation exists.

Figure 4:
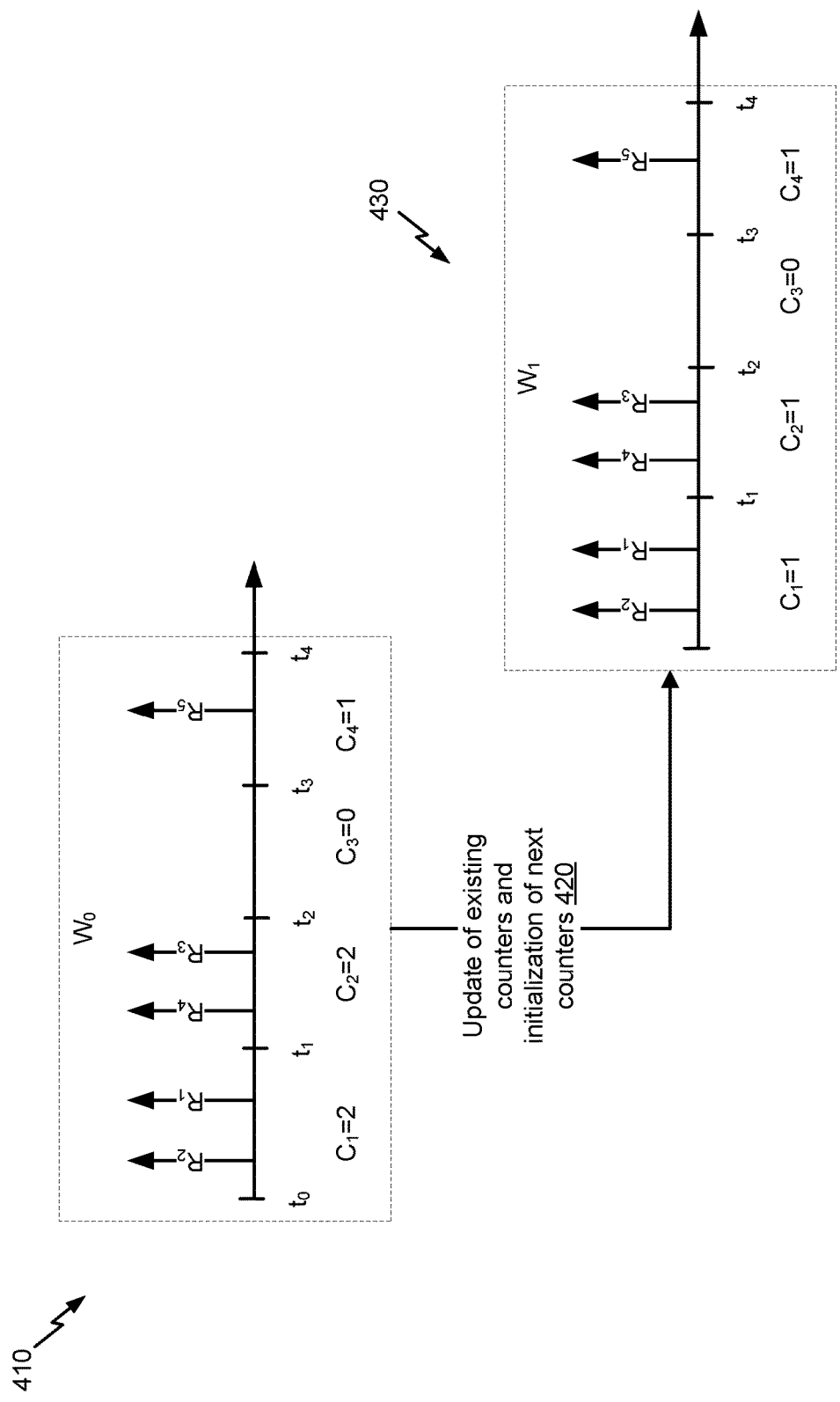
FIG. 4 illustrates an example of updating a latency measurement based on time windows, in accordance with certain embodiments of the present disclosure.

FIG. 4 illustrates an example of updating a latency measurement based on time windows, in accordance with certain embodiments of the present disclosure. Generally, a decoder monitors a latency measurement in a time window. Every often, the latency measurement is updated. The update can rely on a new time window, whereby this time is the current time window. Different triggers can be used for the update and for moving from a first time window to a second time window (e.g., from a previous time window to a current time window). An example trigger includes the number of decoded codewords (or, similarly, the number of processed data read commands). For instance, once this number exceeds a predefined threshold (one million codewords), the time window is shifted. The shift can be complete (e.g., no overlap exists between the time windows). Or, the shift can include an overlap (e.g., the two time windows overlap for a certain time duration such that, some of the decoded codewords (or, similarly, data read commands) in the current time window are common to the previous time window).

For a fresh drive or a power up, the latency counters "C" are initialized to all zeros. The latency counters "C" can be updated every certain number of codewords, for example one million codewords. In an example, to support the update, the decoder maintains two sets of counters "$C_0$" and "$C_1$," one represent current QoS and one represent the QoS of previous time window. For example, if "$C_0$" is current window QoS counter, "$C_1$" is the previous QoS counter. When counting the latency for one million codewords is completed, the update is performed as follows: "$C_0=C_0/2+C_1/2$." If a decimal number exists, the number can be rounded up. The decoder then sets "$C_1$" to all zeros and start counting for next window. Whenever there is a power off, the counters "C" are not saved to the memory.

To illustrate the above example, two time windows are used "$W_0$" and "$W_1$." A first set of counters "$C_0$" is tracked 410 for the time window "$W_0$." If no tracking has been previously performed (e.g., for a fresh drive or a power up), the first set of counters "$C_0$" is initialized to all zeros. Upon a trigger to shift to the next time window "$W_1$," an update of existing counters and an initialization of next counters is performed 420. In particular, the first set of counters "$C_0$" is updated to "$C_0/2+C_1/2$," and thereafter the second set of counters "$C_1$" is initialized to all zeros. Upon performing 420 the update and initialization, the decoder tracks 430 the second set of counters "$C_1$" for the next time window "$W_1$." Upon a trigger for yet another shift, the second set counters "$C_1$" is updated to "$C_0/2+C_1/2$," and thereafter the first set of counters "$C_0$" is re-initialized to all zeros and re-used for the tracking in the next time window, and so on and so forth, such that there is a repeated shift between time windows, and updating, re-initialization, and re-use of the counters "$C_0$" and "$C_1$."

For instance, starting with a power up and assuming four counters in each set, both sets are initialized to zeros: "$C_0$=[0 0 0 0] and $C_1$=[0 0 0 0]." In the initial time window, "$C_0$" is tracked to "[2 2 0 1]." Upon a first shift to a next time window, "$C_0$" is updated to "[2 2 0 1]/2+[0 0 0 0]/2=[1 1 0 1]" (assuming that decimal numbers are rounded up). In the next time window, "$C_1$" is initialized to all zeros and is tracked to "[4 5 2 0]." Upon a second shift to yet another next time, "$C_1$" is updated to "[1 1 0 1]/2+[4 5 2 0]/2=[3 3 1 1]." In this next time window, "$C_0$" is initialized to all zeros and the tracking continues.

Figure 5:
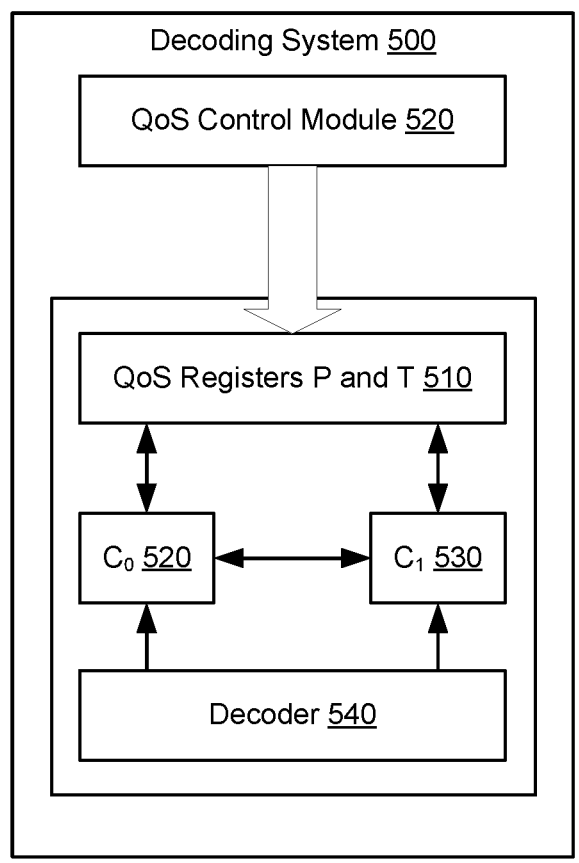
FIG. 5 illustrates an example diagram of a decoding system, in accordance with certain embodiments of the present disclosure.

FIG. 5 illustrates an example diagram of a decoding system 500, in accordance with certain embodiments of the present disclosure. The decoding system 500 represents an ECC decoder that implements the techniques described herein above in connection with FIGS. 3 and 4 and can be part of an enterprise SSD as described in connection with FIG. 2.

In an example, the decoding system 500 includes QoS registers 510 that store a probability vector "P" and a latency vector "T" as specified by a QOS latency specification. These vectors can be configured and stored in the registers by a QoS control module 520 of the decoding system 500. This module 520 can be implemented in firmware and can set the "P" and "T" vectors based on the QOS latency specification as defined in the specification of the enterprise SSD.

The decoding system also maintains a first set of latency counters "$C_0$" 520 and a second set of latency counters "$C_1$" 530. These counters can be stored in memory of the decoding system 500. The decoding system 500 also includes a decoder 540, such as a QoS-aware ECC decoder that implements an ECC decoding procedure and an early termination based on a latency measurement. This decoder 540 updates the two sets of latency counters "$C_0$" 520 and "$C_1$" 530.

Figure 6:
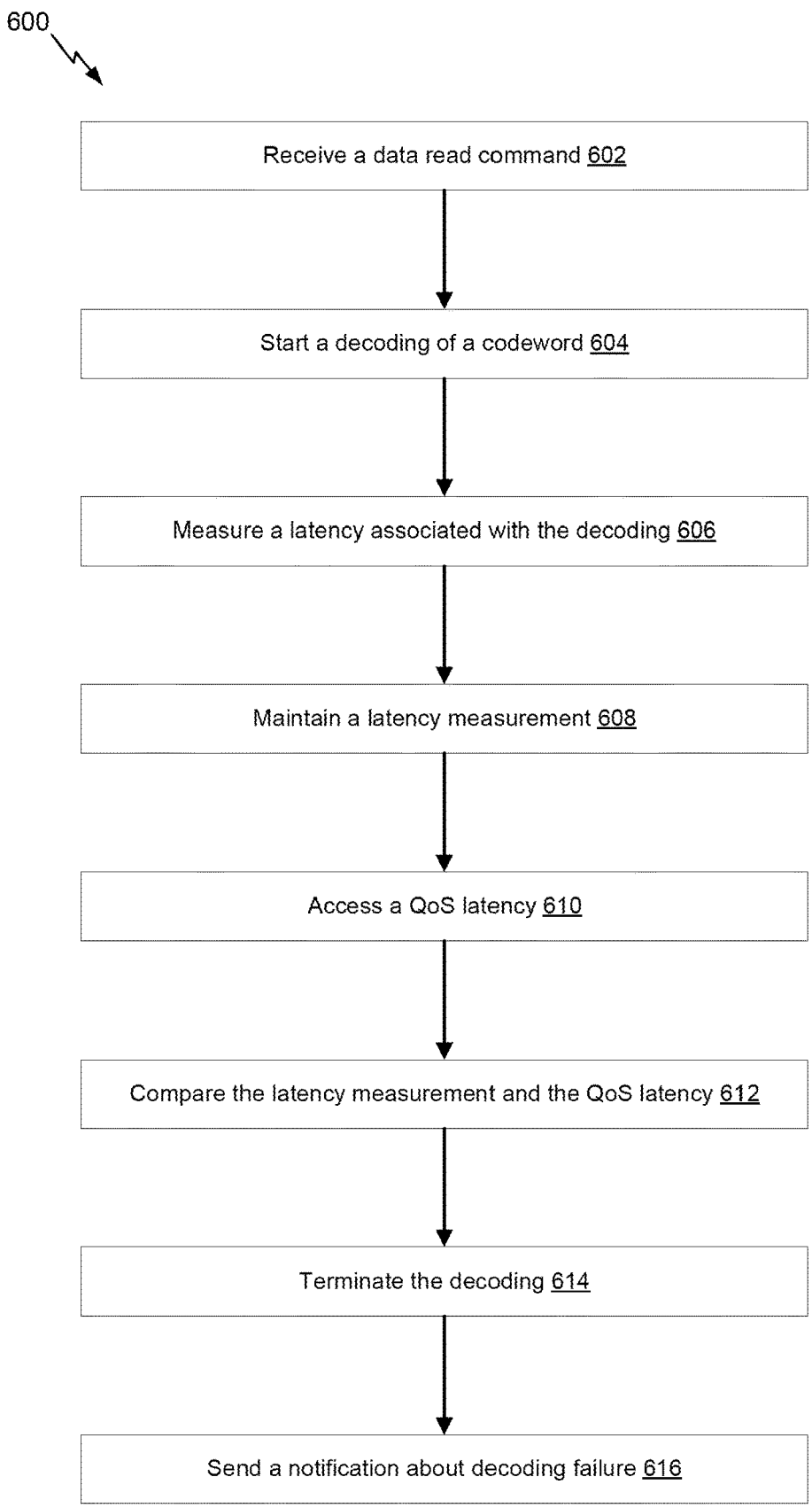
FIG. 6 illustrates an example flow of decoding codewords by a QoS-aware ECC decoder, in accordance with certain embodiments of the present disclosure.
Figure 7:
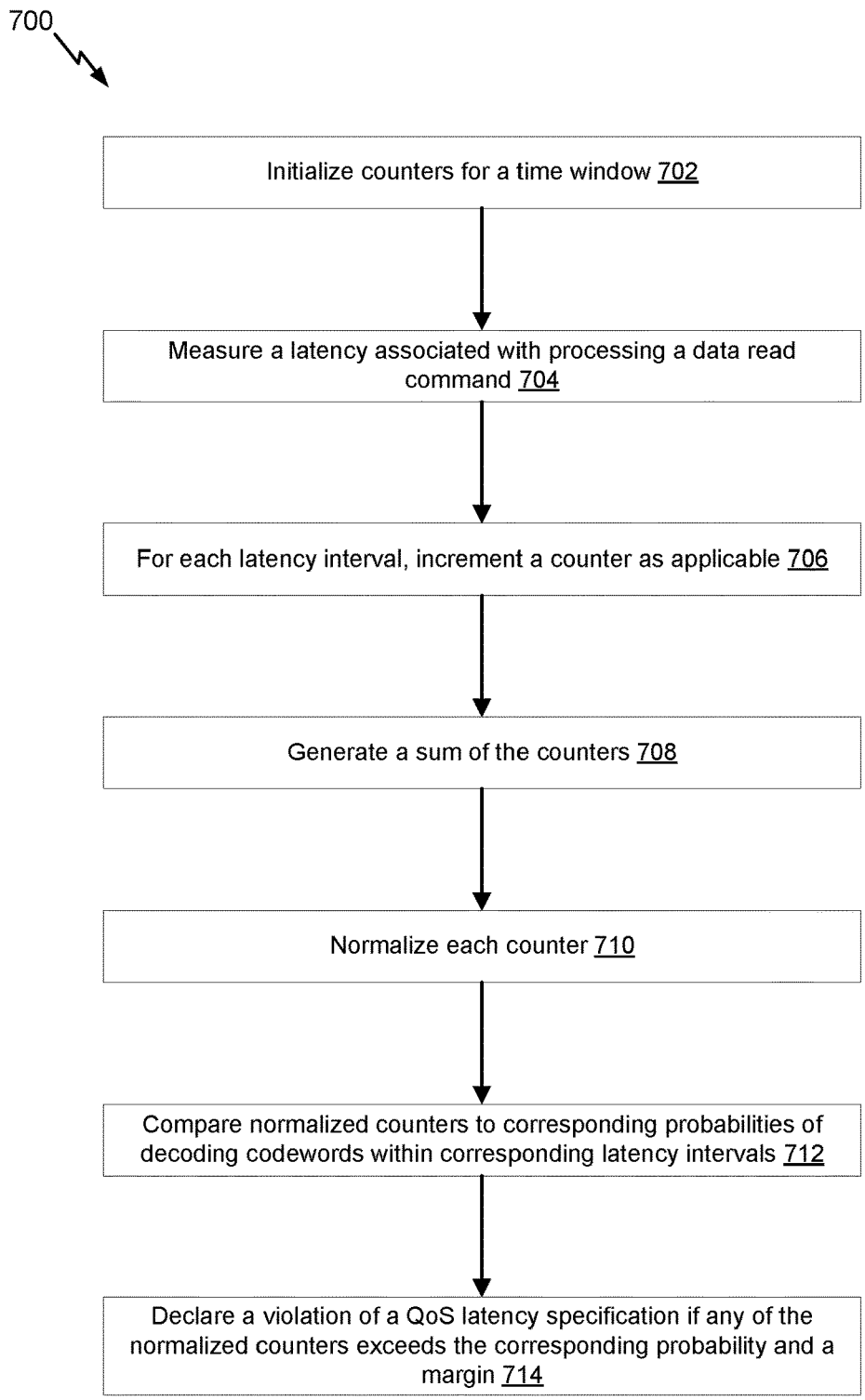
FIG. 7 illustrates an example flow of generating a latency measurement and determining a QoS violation, in accordance with certain embodiments of the present disclosure.
Figure 8:
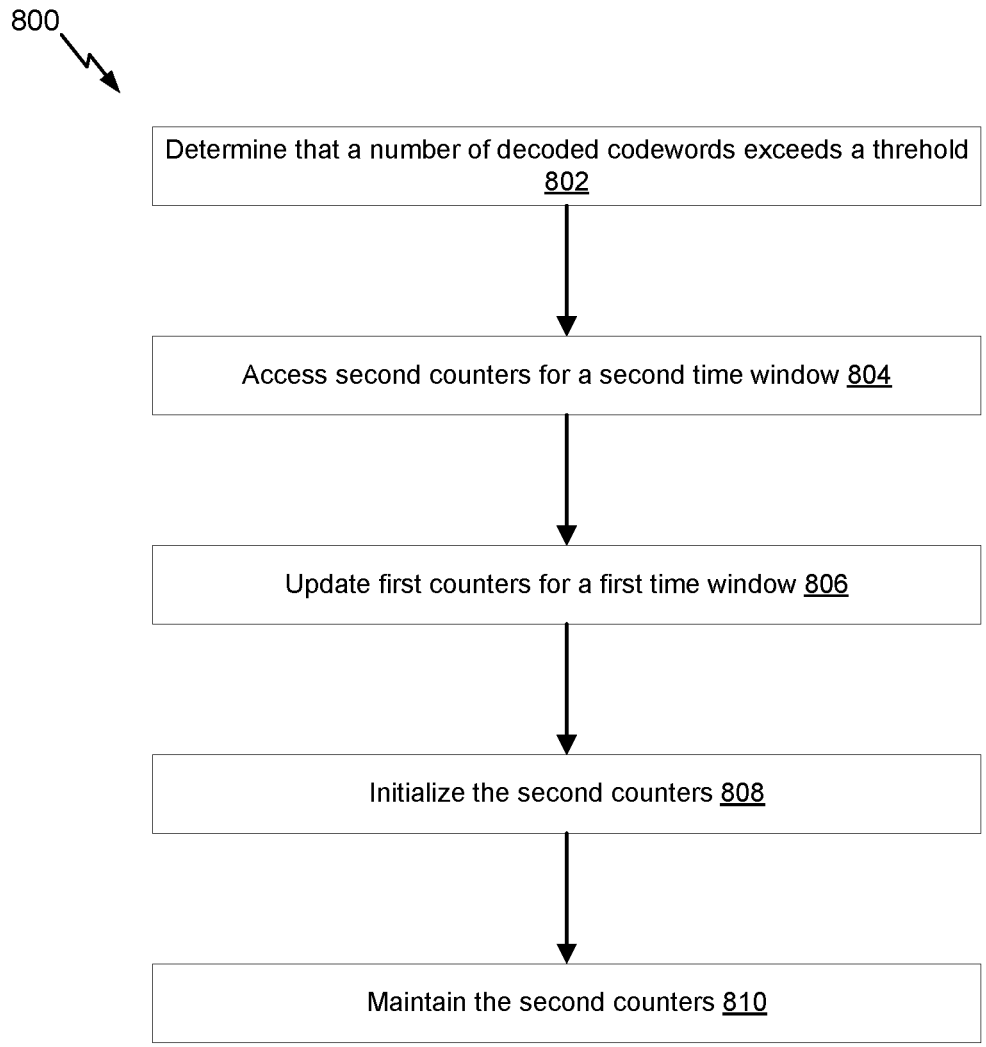
FIG. 8 illustrates an example flow of updating a latency measurement based on time windows, in accordance with certain embodiments of the present disclosure.

FIGS. 6-8 illustrate example flows for decoding codewords based on a QoS-aware ECC decoder. This decoder is described as performing particular operations of the example flows. In particular, the QoS-aware ECC decoder can be a computing component within a computer system, such as within an enterprise SSD or a server as described in connection with FIGS. 1 and 2. The QoS-aware ECC decoder may have a specific hardware configuration to perform the operations. Alternatively or additionally, the QoS-aware ECC decoder may include generic hardware configured with specific instructions. In an example, the QoS-aware ECC decoder includes one or more processors and one or more memories. The memory(ies) stores computer-readable instructions to embody functionalities specific to the QoS-aware ECC decoder. The instructions, when executed by the processor(s), result in performance of the functionalities. The instructions stored in the memory(ies) in conjunction with the underlying processor(s) represent means for performing the functionalities. Some of the operations across the example flows are similar. In the interest of brevity, the similarities are not repeated herein. Further, although the operations are illustrated in a particular order, other arrangement of the operations are possible and some of the operations may be skipped as it would be apparent to a person skilled in the art.

FIG. 6 illustrates an example flow 600 of decoding codewords by a QoS-aware ECC decoder, in accordance with certain embodiments of the present disclosure. The flow 600 may start at operation 602, where the decoder receives a data read command during a time window. The data read command is associated with a codeword stored in a memory (e.g., the memory of the SSD that includes the decoder). The data read command can be received from a host in response to a client request for data of the client stored in the memory. The time window can represent a period of time during which a latency measurement for codeword decoding is tracked. Of course, multiple data read commands can be received during the time window and/or multiple codewords can be decoded during the time window.

At operation 604, the decoder starts a decoding of the codeword based on an ECC procedure. The decoding procedure depends on the type of ECC used to protect the data of the client. For instance, if LDPC encoding is used, the ECC procedure corresponds to LDPC decoding. Generally, the decoding is iterative. The decoding may track the latency measurement at each iteration and, if the latency measurement is likely to violate a QOS latency specification at a decoding iteration, can exit the decoding iteration and terminate the decoding.

At operation 606, the decoder measures a latency associated with the decoding. For example, in the current decoding iteration, the decoder measures the time needed for the decoding.

At operation 608, the decoder maintains a latency measurement for the time window based on the latency. In an example, the latency measurement includes a latency distribution over the time window. The latency distribution can be expressed as a set of latency counters for the time window. These counters are initialized and updated based on the decoding of the codeword (and the decoding of other codewords for the same data read command or for other data read commands received during the time window). Upon a trigger to shift to another time window, the set of counters is further updated. The counters can also be normalized to generate a set of normalized counters.

At operation 610, the decoder accesses a QOS latency specification. In an example, the QOS latency specification includes a specification defining an acceptable decoding latency. The QOS latency specification can be accessed from memory, where it is stored as a probability vector and as a latency vector.

At operation 612, the decoder compares the latency measurement and the QOS latency specification. For example, given the current decoding latency, the decoder determines an index for the normalized counters. The normalized counters having an index equal to or larger than the determined index are compared to corresponding probabilities from the probability vector. The comparison indicates whether a QoS violation is likely to occur or not (e.g., in the next decoding iteration). If the QoS violation is likely to occur, the decoder performs operation 614. Otherwise, the decoder loops back to continue the iterative decoding.

At operation 614, the decoder terminates the decoding based on the comparison indicating that the QoS violation is likely to occur. At operation 616, the decoder sends a notification about a decoding failure. For example, the notification is sent to the host.

FIG. 7 illustrates an example flow 700 of generating a latency measurement and determining a QoS violation, in accordance with certain embodiments of the present disclosure. The operations of the flow 700 can be implemented as sub-operations of operations 608 and 610 of FIG. 6.

The flow 700 of FIG. 7 may start at operation 702, where the decoder initializes counters for a time window. In an example, the counters form a set of latency counters and are initialized to zero.

At operation 704, the decoder measures a latency associated with processing a data read command. In an example, the data read command is received during the time window. The measured latency corresponds to the decoding latency of decoding a codeword associated with the data read command. If other data read commands are received during the time window, the decoder similarly measure the latencies associated with such data read commands.

At operation 706, for each latency measured at operation 704, the decoder increments a counter as applicable. In an example, the decoder accesses latency intervals defined as the difference between latencies specified by the QoS latency specification. Each of the latency counters is associated with one of the latency intervals. The decoder determines that the latency falls within a particular latency interval. Accordingly, the decoder increments the counter that corresponds to this particular latency interval. The counters across the different latency intervals can be similarly updated based on the measured latencies for the different data read commands received during the time window.

At operation 708, the decoder generates a sum of the counters. At operation 710, the decoder normalizes each counter based on the sum. For instance, each of the latency counters is divided by the sum to generate a normalized latency counter.

At operation 712, the decoder compares the normalized counters to corresponding probability of decoding codewords within corresponding latency intervals. In an example, each latency counter corresponds to a time interval. In addition, the QoS latency specification specifies the probabilities. Given a current decoding latency, the decoder determines a latency interval within which the current decoding latency falls and determines the index "j" of the latency interval. The decoder then compares the normalized latency counters each having an index "i" that is equal to or greater than "j" to the corresponding probability having an index "i" plus a predefined safety margin. If the comparison indicates that any of such normalized latency counters is equal to or greater than the corresponding probability plus margin, the decoder determines that a violation of the QoS latency specification is likely to occur.

At operation 714, the decoder declares a violation of the QoS latency specification depending on the outcome of operation 712.

FIG. 8 illustrates an example flow 800 of updating a latency measurement based on time windows, in accordance with certain embodiments of the present disclosure. The operations of the flow 800 can be implemented as sub-operations of operation 608 of FIG. 6. Generally, a latency measurement includes a latency distribution over a time window. The latency distribution can be expressed as a set of latency counters maintained based on the processing of data read commands received during the time window. The latency distribution for one window can be used in the initialization of the latency distribution for another window upon a trigger event. An example of a trigger event includes a number of decoded codewords exceeding a predefined threshold.

The flow 800 of FIG. 8 may start at operation 802, where the decoder determines that the number of decoded codewords exceeds the predefined threshold. In other words, the decoder detects a trigger event to shift from a first time window to a second time window. The shift should be accompanied by an update of the first latency distribution of the first window and an initialization of the second latency distribution of the second window. The update of the first latency distribution relies on the second latency distribution, as previously computed and before being initialized. After the update is performed, the initialization of the second latency distribution can be performed.

At operation 804, the decoder accesses the second counters for the second time window. In an example, the second counters represent the second latency distribution and are accessed based on detecting the trigger event. These counters can be accessed from the memory of the decoder.

At operation 806, the decoder update the first counters for the first time window based on the second counters. In an example, the first counters are incremented based on the processing of data read commands received during the first time window. Upon the trigger event, the first counters are updated as a function of their current value and the second counters (e.g., as half of their current value plus a half of the second counters).

At operation 808, the decoder initializes the second counters. In an example, these counters are initialized to zero.

At operation 810, the decoder maintains the second counters. For example, these counters are incremented depending on the processing of data read commands received during the second time window.

Figure 9:
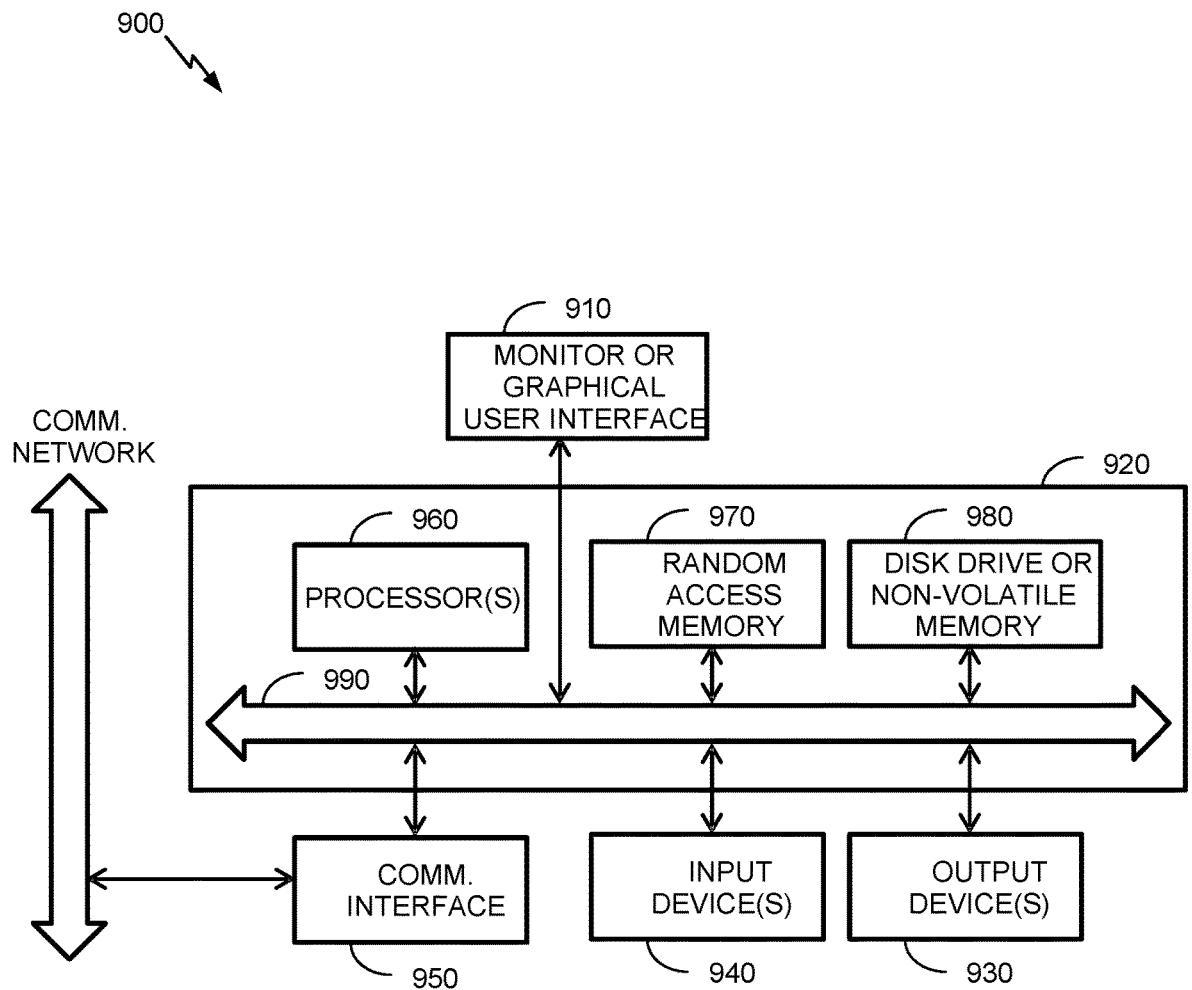
FIG. 9 is representative of a computer system capable of embodying the present disclosure.

FIG. 9 is representative of a computer system capable of embodying the present disclosure, such as the error correction system 100 of FIG. 1. FIG. 9 is merely illustrative of an embodiment of the present disclosure and does not limit the scope of the disclosure as recited in the claims. In one embodiment, the system is a computer system 900 that typically includes a monitor 910, a computer 920, user output devices 930, user input devices 940, communications interface 950, and the like. The error correction system 100 of FIG. 1 implements some or all of the components of the computer system 900.

As shown in FIG. 9, the computer 920 may include a processor(s) 960 that communicates with a number of peripheral devices via a bus subsystem 990. These peripheral devices may include the user output devices 930, the user input devices 940, the communications interface 950, and a storage subsystem, such as random access memory (RAM) 970 and disk drive 980.

The user input devices 940 include all possible types of devices and mechanisms for inputting information to the computer system 920. These may include a keyboard, a keypad, a touch screen incorporated into the display, audio input devices such as voice recognition systems, microphones, and other types of input devices. In various embodiments, the user input devices 940 are typically embodied as a computer mouse, a trackball, a track pad, a joystick, a wireless remote, a drawing tablet, a voice command system, an eye tracking system, and the like. The user input devices 940 typically allow a user to select objects, icons, text and the like that appear on the monitor 910 via a command such as a click of a button or the like.

The user output devices 930 include all possible types of devices and mechanisms for outputting information from the computer 920. These may include a display (e.g., the monitor 910), non-visual displays such as audio output devices, etc.

The communications interface 950 provides an interface to other communication networks and devices. The communications interface 950 may serve as an interface for receiving data from and transmitting data to other systems. Embodiments of the communications interface 950 typically include an Ethernet card, a modem (telephone, satellite, cable, ISDN), (asynchronous) digital subscriber line (DSL) unit, FireWire interface, USB interface, and the like. For example, the communications interface 950 may be coupled to a computer network, to a FireWire bus, or the like. In other embodiments, the communications interfaces 950 may be physically integrated on the motherboard of the computer 920, and may be a software program, such as soft DSL, or the like.

In various embodiments, the computer system 900 may also include software that enables communications over a network such as the HTTP, TCP/IP, RTP/RTSP protocols, and the like. In alternative embodiments of the present disclosure, other communications software and transfer protocols may also be used, for example IPX, UDP or the like. In some embodiments, the computer 920 includes one or more Xeon microprocessors from Intel as the processor(s) 960. Further, one embodiment, the computer 920 includes a UNIX-based operating system.

The RAM 970 and the disk drive 980 are examples of tangible media configured to store data such as embodiments of the present disclosure, including executable computer code, human readable code, or the like. Other types of tangible media include floppy disks, removable hard disks, optical storage media such as CD-ROMS, DVDs and bar codes, semiconductor memories such as flash memories, non-transitory read-only-memories (ROMS), battery-backed volatile memories, networked storage devices, and the like. The RAM 970 and the disk drive 980 may be configured to store the basic programming and data constructs that provide the functionality of the present disclosure.

Software code modules and instructions that provide the functionality of the present disclosure may be stored in the RAM 970 and the disk drive 980. These software modules may be executed by the processor(s) 960. The RAM 970 and the disk drive 980 may also provide a repository for storing data used in accordance with the present disclosure.

The RAM 970 and the disk drive 980 may include a number of memories including a main random access memory (RAM) for storage of instructions and data during program execution and a read-only memory (ROM) in which fixed non-transitory instructions are stored. The RAM 970 and the disk drive 980 may include a file storage subsystem providing persistent (non-volatile) storage for program and data files. The RAM 970 and the disk drive 980 may also include removable storage systems, such as removable flash memory.

The bus subsystem 990 provides a mechanism for letting the various components and subsystems of the computer 920 communicate with each other as intended. Although the bus subsystem 990 is shown schematically as a single bus, alternative embodiments of the bus subsystem may utilize multiple busses.

FIG. 9 is representative of a computer system capable of embodying the present disclosure. It will be readily apparent to one of ordinary skill in the art that many other hardware and software configurations are suitable for use with the present disclosure. For example, the computer may be a desktop, portable, rack-mounted, or tablet configuration. Additionally, the computer may be a series of networked computers. Further, the use of other microprocessors are contemplated, such as Pentium™ or Itanium™ microprocessors; Opteron™ or AthlonXP™ microprocessors from Advanced Micro Devices, Inc., and the like. Further, other types of operating systems are contemplated, such as Windows®, WindowsXP®, WindowsNT®, or the like from Microsoft Corporation, Solaris from Sun Microsystems, LINUX, UNIX, and the like. In still other embodiments, the techniques described above may be implemented upon a chip or an auxiliary processing board.

Various embodiments of the present disclosure can be implemented in the form of logic in software or hardware or a combination of both. The logic may be stored in a computer readable or machine-readable non-transitory storage medium as a set of instructions adapted to direct a processor of a computer system to perform a set of steps disclosed in embodiments of the present disclosure. The logic may form part of a computer program product adapted to direct an information-processing device to perform a set of steps disclosed in embodiments of the present disclosure. Based on the disclosure and teachings provided herein, a person of ordinary skill in the art will appreciate other ways and/or methods to implement the present disclosure.

The data structures and code described herein may be partially or fully stored on a computer-readable storage medium and/or a hardware module and/or hardware apparatus. A computer-readable storage medium includes, but is not limited to, volatile memory, non-volatile memory, magnetic and optical storage devices such as disk drives, magnetic tape, CDs (compact discs), DVDs (digital versatile discs or digital video discs), or other media, now known or later developed, that are capable of storing code and/or data. Hardware modules or apparatuses described herein include, but are not limited to, application-specific integrated circuits (ASICs), field-programmable gate arrays (FPGAs), dedicated or shared processors, and/or other hardware modules or apparatuses now known or later developed.

The methods and processes described herein may be partially or fully embodied as code and/or data stored in a computer-readable storage medium or device, so that when a computer system reads and executes the code and/or data, the computer system performs the associated methods and processes. The methods and processes may also be partially or fully embodied in hardware modules or apparatuses, so that when the hardware modules or apparatuses are activated, they perform the associated methods and processes. The methods and processes disclosed herein may be embodied using a combination of code, data, and hardware modules or apparatuses.

Although the foregoing embodiments have been described in some detail for purposes of clarity of understanding, the disclosure is not limited to the details provided. There are many alternative ways of implementing the disclosure. The disclosed embodiments are illustrative and not restrictive.

What is claimed is:

1. A computer-implemented method comprising:
   receiving, by an error correction code (ECC) decoder, a data read command during a time window, the data read command associated with a codeword stored in a memory;
   starting, by the ECC decoder, a decoding of the codeword based on an ECC procedure;
   measuring, by the ECC decoder, a latency associated with the decoding;
   determining a latency interval to which the latency belongs;
   maintaining, by the ECC decoder, a latency measurement for the time window based on the latency, wherein maintaining the latency measurement includes updating normalized counter values of the latency measurement corresponding to a plurality of latency intervals, including the latency interval, based on the determined latency interval;
   comparing, by the ECC decoder, the latency measurement and one or more threshold values to determine whether the latency measurement exceeds the one or more threshold values, the one or more threshold values generated based on a set of probabilities that are associated with one or more time latencies in a quality of service (QoS) latency specification, wherein comparing the latency measurement and the one or more threshold values includes comparing the normalized counter values to corresponding threshold values from the one or more threshold values; and
   terminating, by the ECC decoder, the decoding in response to determining that the latency measurement exceeds the one or more threshold values.

2. The computer-implemented method of claim 1, wherein the latency measurement comprises a latency distribution over the time window.

3. The computer-implemented method of claim 2, wherein the latency distribution comprises a first normalized counter associated with first data read commands processed by the ECC decoder within a first latency interval, and wherein the latency distribution further comprises a second normalized counter associated with second data read commands processed by the ECC decoder within a second latency interval.

4. The computer-implemented method of claim 3, wherein the latency distribution is generated by the ECC decoder by at least:
   determining that the latency associated with the decoding in response to the data read command falls within the first latency interval;
   incrementing a first counter associated with the first latency interval based on the determining that the latency falls with the first latency interval;
   generating a sum of the first counter and at least a second counter associated with the second latency interval; and
   generating the first normalized counter based on first count and the sum.

5. The computer-implemented method of claim 3, wherein a portion of the first data read commands is received in the time window, and wherein a remaining portion of the first data read commands is received in a previous time window.

6. The computer-implemented method of claim 1, wherein the latency measurement comprises a normalized counter associated with data read commands processed by the ECC decoder within the latency interval, and wherein determining that the latency measurement exceeds the one or more threshold values comprises determining that the normalized counter exceeds a threshold value of the one or more threshold values associated with a time latency of the one or more time latencies corresponding to the latency interval.

7. The computer-implemented method of claim 1, further comprising:
   detecting, by the ECC decoder, a trigger event to shift from the time window to a second time window;
   accessing, by the ECC decoder, a second latency measurement for the second time window based on the trigger event; and
   updating, by the ECC decoder, the latency measurement based on the second latency measurement.

8. The computer-implemented method of claim 7, wherein the second latency measurement comprises a second latency distribution, and further comprising:
   initializing, by the ECC decoder, the second latency measurement for the second time window after the updating of the latency measurement.

9. The computer-implemented method of claim 7, wherein detecting the trigger event comprises:
   determining that a number of decoded codewords has reached a threshold; and
   shifting the time window to the second time window based on determining that the number of decoded codewords has reached the threshold.

10. The computer-implemented method of claim 1, further comprising generating, by the ECC decoder, the one or more threshold values based on the set of probabilities by adding a predetermined margin to each probability within the set of probabilities to generate the one or more threshold values.

11. The computer-implemented method of claim 1, wherein comparing the latency measurement and the one or more threshold values includes comparing a portion of the normalized counter values corresponding to latency intervals greater than or equal to the latency interval to the corresponding threshold values from the one or more threshold values.

12. A system comprising:
a memory; and
error correction code (ECC) decoder communicatively coupled with the memory and configured to:
receive a data read command during a time window, the data read command associated with codewords stored in the memory;
start a decoding of the codewords based on an ECC procedure;
measure a latency associated with the decoding;
determine a latency interval to which the latency belongs;
maintain a latency measurement for the time window based on the latency, wherein maintaining the latency measurement includes updating normalized counter values of the latency measurement corresponding to a plurality of latency intervals, including the latency interval, based on the determined latency interval;
compare the latency measurement and one or more threshold values to determine whether the latency measurement exceeds the one or more threshold values, the one or more threshold values generated based on a set of probabilities that are associated with one or more time latencies in a quality of service (QoS) latency specification, wherein comparing the latency measurement and the one or more threshold values includes comparing the normalized counter values to corresponding threshold values from the one or more threshold values; and
terminate the decoding in response to determining that the latency measurement exceeds the one or more threshold values.

13. The system of claim 12, wherein the data read command is received from a host, and wherein the ECC decoder is further configured to send an indication of a decoding failure to the host based on the terminating of the decoding.

14. The system of claim 12, wherein the set of probabilities comprises a probability of completing a processing of the data read command within the latency interval, wherein the ECC decoder is further configured to store the probability in a first vector and the latency interval in a second vector.

15. The system of claim 14, wherein the first vector is stored in a register that is configurable by a firmware of the ECC decoder.

16. The system of claim 14, wherein the latency measurement comprises a normalized counter associated with data read commands processed by the ECC decoder within the latency interval, and wherein the ECC decoder is further configured to store the normalized counter in a third vector.

17. The system of claim 16, wherein comparing the latency measurement and the one or more threshold values comprises comparing the first vector and the third vector, and wherein the decoding is terminated based on the comparing of the first vector and the third vector indicating a violation of the QoS latency specification based on exceeding the one or more threshold values.

18. A non-transitory computer-readable storage medium storing instructions that, upon execution on an error correction code (ECC) decoder, cause the ECC decoder to perform operations comprising:
receiving a data read command during a time window, the data read command associated with a codeword stored in a memory;
starting a decoding of the codewords based on an ECC procedure;
measuring a latency associated with the decoding;
determining a latency interval to which the latency belongs;
maintaining a latency measurement for the time window based on the latency, wherein maintaining the latency measurement includes updating normalized counter values of the latency measurement corresponding to a plurality of latency intervals, including the latency interval, based on the determined latency interval;
comparing the latency measurement and one or more threshold values to determine whether the latency measurement exceeds the one or more threshold values, the one or more threshold values generated based on a set of probabilities that are associated with one or more time latencies in a quality of service (QoS) latency specification, wherein comparing the latency measurement and the one or more threshold values includes comparing the normalized counter values to corresponding threshold values from the one or more threshold values; and
terminating the decoding in response to determining that the latency measurement exceeds the one or more threshold values.

19. The non-transitory computer-readable storage medium of claim 18, wherein the latency measurement comprises a latency distribution over the time window, wherein the latency distribution comprises a first normalized counter associated with first data read commands processed by the ECC decoder within a first latency interval, and wherein the latency distribution further comprises a second normalized counter associated with second data read commands processed by the ECC decoder within a second latency interval.

20. The non-transitory computer-readable storage medium of claim 19, wherein the latency distribution is generated by the ECC decoder by at least:
determining that the latency associated with the decoding in response to the data read command falls within the first latency interval;
incrementing a first counter associated with the first latency interval based on the determining that the latency falls with the first latency interval;
generating a sum of the first counter and at least a second counter associated with the second latency interval; and
generating the first normalized counter based on the first counter and the sum.

* * * * *